United States Patent
Milke et al.

(10) Patent No.: US 9,236,166 B2
(45) Date of Patent: Jan. 12, 2016

(54) CORE-JACKET BONDING WIRE

(75) Inventors: Eugen Milke, Frankfurt (DE); Jürgen Dick, Bruchköbel (DE); Peter Prenosil, Maintal (DE); Frank-Werner Wulff, Hanau (DE); Poh Yoong Kong, legal representative, Singapore (SG)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 268 days.

(21) Appl. No.: 13/811,419

(22) PCT Filed: Jul. 18, 2011

(86) PCT No.: PCT/EP2011/003585
§ 371 (c)(1),
(2), (4) Date: May 6, 2013

(87) PCT Pub. No.: WO2012/022404
PCT Pub. Date: Feb. 23, 2012

(65) Prior Publication Data
US 2013/0213689 A1 Aug. 22, 2013

(30) Foreign Application Priority Data
Jul. 22, 2010 (DE) .......................... 10 2010 031 993

(51) Int. Cl.
*H01B 5/02* (2006.01)
*H01L 23/00* (2006.01)
*B21F 45/00* (2006.01)

(52) U.S. Cl.
CPC *H01B 5/02* (2013.01); *B21F 45/00* (2013.01); *H01L 24/43* (2013.01); *H01L 24/45* (2013.01);
(Continued)

(58) Field of Classification Search
CPC ............. H01B 5/00–5/16; H01L 24/00–24/98; H01L 2224/00–2224/98; H01L 2924/00–2924/40503
USPC .......................................... 174/126.2; 72/377
See application file for complete search history.

(56) References Cited

U.S. PATENT DOCUMENTS 3,645,123 A * 2/1972 Auge .............................. 72/286
5,364,706 A * 11/1994 Toyofuku et al. ............. 428/607
(Continued)

FOREIGN PATENT DOCUMENTS

DE         4232745 A1     3/1994
DE   102006025870 A1   12/2007
(Continued)

OTHER PUBLICATIONS

Chapter 4—The Wire, Sep. 6, 1999, bwcrs.eecs.berkeley.edu/Classes/icdesign/ee141_f01/Notes/Chapter4.pdf Section 4.3—p. 115, 116.*
(Continued)

*Primary Examiner* — Jeremy C Norris
*Assistant Examiner* — Muhammed Azam
(74) *Attorney, Agent, or Firm* — Panitch Schwarze Belisario & Nadel LLP

(57) ABSTRACT

A bonding wire is provided containing a wire core made of a first material containing a metal and a wire jacket that envelopes the wire core and is made of a second material containing a metal. The wire core and the wire jacket are made of different metals and the bonding wire has an aspect ratio of no more than 0.8. The bonding wire efficiently prevents damage to bonding surfaces during the bonding process and short-circuiting during the use of corresponding sub-assemblies.

6 Claims, 1 Drawing Sheet

(52) U.S. Cl.
CPC . *H01L 2224/4321* (2013.01); *H01L 2224/4381* (2013.01); *H01L 2224/43825* (2013.01); *H01L 2224/43826* (2013.01); *H01L 2224/43847* (2013.01); *H01L 2224/43848* (2013.01); *H01L 2224/45012* (2013.01); *H01L 2224/45014* (2013.01); *H01L 2224/45015* (2013.01); *H01L 2224/45016* (2013.01); *H01L 2224/45139* (2013.01); *H01L 2224/45144* (2013.01); *H01L 2224/45147* (2013.01); *H01L 2224/45565* (2013.01); *H01L 2224/45624* (2013.01); *H01L 2224/45644* (2013.01); *H01L 2224/45664* (2013.01); *H01L 2224/45686* (2013.01); *H01L 2224/45687* (2013.01); *H01L 2224/85001* (2013.01); *H01L 2924/00014* (2013.01); *H01L 2924/01005* (2013.01); *H01L 2924/01006* (2013.01); *H01L 2924/01013* (2013.01); *H01L 2924/01029* (2013.01); *H01L 2924/01046* (2013.01); *H01L 2924/01047* (2013.01); *H01L 2924/01061* (2013.01); *H01L 2924/01068* (2013.01); *H01L 2924/01074* (2013.01); *H01L 2924/01079* (2013.01); *H01L 2924/01327* (2013.01); *H01L 2924/1461* (2013.01); *H01L 2924/15787* (2013.01); *H01L 2924/2076* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01); *H01L 2924/20756* (2013.01); *H01L 2924/20757* (2013.01); *H01L 2924/20758* (2013.01); *H01L 2924/20759* (2013.01)

(56) References Cited

U.S. PATENT DOCUMENTS 5,483,021 A * 1/1996 Saen et al. .............. 174/117 FF
2001/0020545 A1* 9/2001 Eldridge et al. .............. 174/260
2001/0038915 A1* 11/2001 Tamura et al. ................ 428/375
2007/0284415 A1* 12/2007 Hosseini ....................... 228/101
2007/0290373 A1 12/2007 Reinold et al.
2008/0061450 A1* 3/2008 Reinold et al. ................ 257/784
2009/0079042 A1 3/2009 Clatterbaugh et al.
2010/0107717 A1 5/2010 Lehr et al.
2010/0282495 A1* 11/2010 Uno et al. .................. 174/126.2
2013/0127026 A1 5/2013 Ikeda et al.

FOREIGN PATENT DOCUMENTS

| DE | 102006060899 A1 | 7/2008 |
|---|---|---|
| EP | 1279491 A1 | 1/2003 |
| JP | S55-85035 A | 6/1980 |
| JP | S58-57305 A | 4/1983 |
| JP | S62-97360 A | 5/1987 |
| JP | S62-287634 A | 12/1987 |
| JP | S64-42138 A | 2/1989 |
| JP | H02-211646 A | 8/1990 |
| JP | 2004-128216 A | 4/2004 |
| JP | 2004-519993 A | 7/2004 |
| JP | 2007-324603 A | 12/2007 |
| WO | 2005067040 A1 | 7/2005 |

OTHER PUBLICATIONS

Office Action issued Dec. 3, 2013 in DE Application No. 11 749 078.9.

Int'l Search Report issued Jun. 6, 2012 in Int'l Application No. PCT/EP2011/003585.

Office Action issued Dec. 16, 2014 in CN Application No. 201180035829.X (English translation only).

Office Action issued Oct. 7, 2014 in JP Application No. 2013-520000.

* cited by examiner

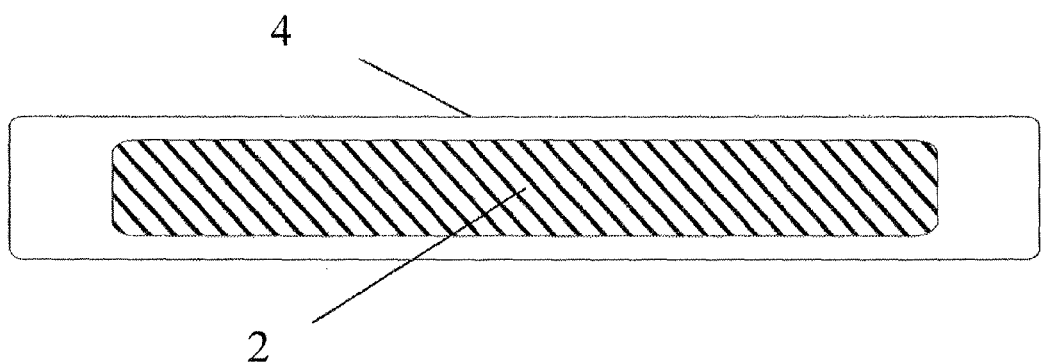

CORE-JACKET BONDING WIRE

CROSS-REFERENCE TO RELATED APPLICATIONS

This application is a Section 371 of International Application No. PCT/EP2011/003585, filed Jul. 18, 2011, which was published in the German language on Feb. 23, 2012 under International Publication No. WO 2012/022404 A3, and the disclosure of which is incorporated herein by reference.

BACKGROUND OF THE INVENTION

The present invention relates to a bonding wire, a sub-assembly comprising the bonding wire, and a method for producing the bonding wire.

Bonding wires are often used in microelectronics for electrical contacting of semiconductor chips to a support substrate, such as, for example, a wiring support.

It is customary to use round thin wires or thick wires differing in cross-section. The diameter of thin wires is in the range of 17-100 µm, whereas thick wires are characterized by diameters of 100-500 µm.

In recent years, it has become established that it may be of advantage, depending on the specific application, to use round bonding wires that may consist of multiple sheets or layers of different materials.

Accordingly, it is known, for example from DE 42 32 745, that the reliability of ultrasound bonding may be improved through the use of bonding wires made of gold or copper having a jacket made of aluminum for this purpose.

EP 1 279 491 proposes, for cost reasons, to reduce the amount of gold in bonding wires by providing gold-coated bonding wires made of copper, silver or palladium rather than pure gold wires.

According to JP 62-97360, bonding wires made of copper are protected from oxidation by coating them with a layer made of an oxidation-resistant material.

Although bonding wires having a round cross-section, as described above, are suitable for many applications, the use of so-called ribbon wires has also been established for many years. These wires are characterized in that they do not have a round cross-section, but rather have an elliptical or rectangular cross-section, and are used mainly for bonding in power components. The larger, but also flatter, geometry of ribbon wires has a practical advantage in that the processing is more rapid since only a small number of ribbon wires, rather than many thinner bonding wires, need to be bonded to attain contacting. Moreover, the surfaces to be contacted through the bonding wire (bond pads) are better covered by ribbon wires since there is hardly any widening at the base. Further, the flat geometry of ribbon wires allows lower loops to be generated. In addition, the heel damage at comparable loop geometry, i.e., the damage in the sensitive arc of the bonding material, is clearly less pronounced than with comparable thick wires. This allows unusually high steps to be bridged by short bonds and thus to implement densely packed geometries in housing bonding.

In order to combine the above-mentioned advantages associated with the use of bonding wires having multiple layers made of different materials and the advantages associated with the use of ribbon wires, it has been proposed to produce ribbon wires having a sandwich structure.

DE 10 2006 060 899 A1, for example, discloses a bonding wire that comprises a solderable coating on one side and a bondable coating on the opposite side.

DE 10 2006 025 870 A1 also describes a bonding wire with a sandwich structure and comprises at least three layers, namely two outer layers and at least one intervening layer. This bonding wire may be produced by hot rolling, which ensures that the different layers of the bonding wire are exclusively arranged to be parallel to each other, and thus are visible in a side view of the wire.

However, tests have shown that prior art bonding wires having a sandwich structure are associated with various disadvantages, in addition to the positive properties that have been achieved thus far. For example, it has been noted that the bonding of bonding wires having a sandwich structure is often associated with damage to the surfaces of the chips and/or supports (bonding surfaces) to be connected. Moreover, it has been evident that the risk of short-circuiting is markedly higher when sub-assemblies containing ribbon wires having a sandwich structure are used.

BRIEF SUMMARY OF THE INVENTION

The present invention is therefore based on the objective of combining the advantages associated with the use of bonding wires having multiple layers made of different materials and the advantages associated with the use of ribbon wires, while avoiding the disadvantages resulting from the use of bonding wires having sandwich structures known from the prior art.

This objective is met according to the invention by a bonding wire comprising a wire core made of a first material and a wire jacket that envelopes the wire core and is made of a second material, wherein the first material comprises a first metal and the second material comprises a second metal different from the first metal, and wherein the bonding wire has an aspect ratio of no more than 0.8.

The scope of the invention also includes a sub-assembly comprising at least one substrate and one component that are connected by means of a bonding wire of this type.

The bonding wire may be produced through a method involving: (i) providing a round wire comprising a wire core made of a first material and a wire jacket that envelopes the wire core and is made of a second material, wherein the first material comprises a first metal and the second material comprises a second metal different from the first metal, and (ii) reforming the round wire.

The invention is based on the finding that the damage to bonding surfaces observed to occur upon bonding prior art ribbon wires having sandwich structures and the increased risk of short-circuiting upon the use of sub-assemblies provided with these ribbon wires are related to the sandwich structure of the ribbon wires.

In order to generate prior art sandwich structures, ribbons made of a first material are coated with a second material. The ribbons are then usually flat-rolled to produce corresponding foils having a sandwich structure. In order to finally obtain bonding wires, wires are cut from the foils using suitable cutting tools. This produces a cutting burr along the longitudinal side of the bonding wires, i.e., perpendicular to their cross-section. This burr not only causes damage to the bonding surfaces during the bonding process, but also causes short-circuits that are often observed to occur upon the use of sub-assemblies containing the ribbon wires having a sandwich structure.

Accordingly, the cutting burr of ribbon wires having a sandwich structure according to the prior art is produced because the production involves, firstly, generating a composite having a sandwich structure which then needs to be cut, which results in the formation of cutting burrs.

In contrast, the bonding wires according to the invention which contain a wire core made of a first material and a wire jacket that envelopes the wire core and is made of a second material cannot be produced by this procedure. Rather, the bonding wires according to the invention are produced by first providing a suitable core-jacket round wire and then reforming the wire without the use of cutting tools.

Accordingly, the invention provides a bonding wire in the form of a ribbon wire comprising a wire core made of a first material and a wire jacket that envelopes the wire core and is made of a second material, in which the first material comprises a first metal and the second material comprises a second metal different from the first metal. Due to production details, the bonding wire contains no burrs that might cause damage to the bonding surfaces during bonding or short-circuiting upon operation of sub-assemblies provided with the bonding wires. Moreover, the bonding wire comprises no open contacting sites between the first material of the core and the second material of the jacket enveloping the core, which is necessarily the case with bonding wires having a sandwich structure. This generates no sites of attack for corrosion of the wires during their manufacture and use, unlike ribbon wires having a sandwich structure according to the prior art. Moreover, the invention excludes oxidation of the material of the wire core, whereas the individual layers of the sandwich structure of ribbon wires having a sandwich structure according to the prior art are exposed to ambient air and thus are available for oxidation.

BRIEF DESCRIPTION OF THE SEVERAL VIEWS OF THE DRAWINGS

The foregoing summary, as well as the following detailed description of the invention, will be better understood when read in conjunction with the appended drawing. For the purpose of illustrating the invention, there are shown in the drawing embodiments which are presently preferred. It should be understood, however, that the invention is not limited to the precise arrangements and instrumentalities shown.

In the drawing:

FIG. 1 is a schematic of bonding wire according to an embodiment of the invention containing a core material and a jacket material.

DETAILED DESCRIPTION OF THE INVENTION

The bonding wire according to the invention comprises a wire core made of a first material 2 and a wire jacket that envelopes the wire core and is made of a second material 4, as shown in FIG. 1.

The term "wire core" shall be understood to mean a structure that is fully enveloped by the wire jacket. The term "wire jacket" shall be understood to be a layer that fully envelopes the wire core. The thickness of the wire jacket is not limited in any way, but preferably is at least 10 nm, more preferably at least 30 nm, even more preferably at least 250 nm, particularly preferably at least 500 nm, even more particularly preferably at least 1 μm and in particular at least 10 μm.

According to the scope of the invention, the wire core is fully enveloped by the wire jacket if the material of the wire core is not situated at the surface of the bonding wire along the longitudinal side of the bonding wire, but rather is covered through the wire jacket. However, it can be preferred according to the invention for both the material of the wire core and the material of the wire jacket to be situated at the surfaces of the transverse sides of the bonding wire.

According to the invention, the bonding wires may consist of the wire core and the wire jacket or may comprise at least one further layer in addition to the wire core and the wire jacket. The scope of the invention therefore also includes bonding wires comprising a wire core, a wire jacket, and at least one further layer enveloping the wire core. The at least one further layer may be situated between the wire core and the wire jacket or may fully envelop both the wire core and the wire jacket. Accordingly, according to the invention, the wire core does not necessarily have to contact the wire jacket directly. It is sufficient for the wire jacket to envelop the wire core, and it is not significant whether or not the wire core is also enveloped by further layers and where the layers are situated with respect to wire core and wire jacket. Accordingly, it is also conceivable that the wire core is enveloped by multiple layers and thus multiple layers are conceivable as the wire jacket.

According to a particularly preferred embodiment, the wire core is a structure that has a homogeneous composition. This structure is preferably situated on the inside of the bonding wire. Therefore, it preferably has a larger distance to the wire surface than all other structures that may be present in the bonding wire. Moreover, this structure preferably does not envelop any other structures.

According to another particularly preferred embodiment, the wire jacket is a layer having a homogeneous composition. The layer is preferably situated on the outside of the bonding wire.

According to the invention, the wire core of the bonding wire consists of a first material and the wire jacket of the bonding wire consists of a second material. In this context, the first material of the wire core is different from the second material of the wire jacket.

The first material of the wire core and the second material of the wire jacket are preferably selected such that certain desired properties of the bonding wires are obtained. For example, in order to increase the reliability during ultrasound bonding, gold or copper may be used as materials for the wire core and aluminum may be used as material for the wire jacket. On the other hand, in order to reduce the production costs of the bonding wire, copper may be used as material for the wire core and gold may be used as material for the wire jacket. In order to obtain an oxidation-protected bonding wire, for example, a wire core made of an oxidation-sensitive material, such as copper, and a wire jacket made of an oxidation-insensitive material, such as palladium, may be provided. Accordingly, particularly preferred bonding wires comprise a wire core made of copper and a wire jacket made of aluminum, a wire core made of gold and a wire jacket made of aluminum, a wire core made of copper and a wire jacket made of gold or a wire core made of copper and a wire jacket made of palladium. In addition, the implementation of a large number of further combinations of wire core and wire jacket materials is feasible in order to produce bonding wires having the properties desired in the respective application.

Accordingly, the composition of the wire core material is not limited. According to a preferred embodiment, the material is a pure metal, a compound, an inter-metallic phase, or an alloy. According to a particularly preferred embodiment, the wire core material is copper, a copper compound, a copper alloy, or an inter-metallic phase containing copper.

According to the explanations provided above, the wire jacket material is not limited either. According to a preferred embodiment, this material is also a pure metal, a compound, an inter-metallic phase, or an alloy. According to a particularly preferred embodiment, the wire jacket material is aluminum, an aluminum compound (for example aluminum oxide), an aluminum alloy, or an inter-metallic phase containing aluminum.

According to the invention, the first material of the wire core comprises a first metal and the second material of the wire jacket comprises a second metal, in which the first metal is different from the second metal.

The first material of the wire core therefore contains at least one first metal. The first metal may be the first material or may be part of a compound, alloy, or inter-metallic phase containing the first metal. According to a preferred embodiment, the first material of the wire core contains at least 25% by weight and more preferably at least 50% by weight of the first metal.

The second material of the wire jacket contains at least one second metal. The second metal may be the second material or may be part of a compound, alloy, or inter-metallic phase containing the second metal. According to a preferred embodiment, the second material of the wire jacket contains at least 25% by weight and more preferably at least 50% by weight of the second metal.

Accordingly, the scope of the invention does not comprise bonding wires having a wire core made of a metal and a wire jacket made of an oxide of the metal, since the first material of the wire core and the second material of the wire jacket do not comprise different metals.

In contrast, the scope of the invention does comprise bonding wires having a wire core made of a first metal, a layer made of a second metal that is different from the first metal, and a layer that envelopes this layer and is made of an oxide of the second metal.

Due to diffusion phenomena, distinct borders between the wire core and the wire jacket may disappear during the production and/or storage of the bonding wires according to the invention, which comprise a wire core made of a first material and a wire jacket that envelopes the wire core and is made of a second material. In particular, material from the wire core may diffuse into the material of the wire jacket and material from the wire jacket may diffuse into the material of the wire core. This may lead, for example, to the formation of alloys that are situated between the wire core and the wire jacket. These alloys usually consist of elements that are present in the material of the wire core and in the material of the wire jacket and usually comprise a gradient, whereby the content of the element of the material of the wire core decreases from the inside of the wire towards the surface of the wire, and the content of the element of the material of the wire jacket decreases from the surface of the wire towards the inside of the wire.

However, according to the scope of the invention, the bonding wire does not consist exclusively of a single homogeneous alloy or inter-metallic phase of at least two materials, and the bonding wire contains at least two phases that form the wire core and the wire jacket and contain different metals. According to a preferred embodiment, the fraction of the first material of the wire core accounted for by the first metal is at least 25% by weight and more preferably at least 50% by weight, and the fraction of the second material of the wire jacket accounted for by the second metal is at least 25% by weight and more preferably at least 50% by weight. Accordingly, the scope of the invention includes a wire having (i) a wire core made of copper, (ii) a layer made of aluminum, (iii) a layer made of an inter-metallic phase containing aluminum and copper that is situated between the wire core and the layer made of aluminum, and (iv) a layer made of aluminum oxide enveloping the layer made of aluminum.

According to the invention, the bonding wire has an aspect ratio of no more than 0.8, preferably no more than 0.6, even more preferably no more than 0.5, particularly preferably no more than 0.4, even more particularly preferably no more than 0.3, and in particular no more than 0.2. Preferably, the aspect ratio is in the range of 1:2 to 1:500, even more preferably in the range of 1:3 to 1:200, particularly preferably in the range of 1:4 to 1:100, and even more particularly preferably in the range of 1:5 to 1:50.

In this context, "aspect ratio" shall be understood to mean the reciprocal ratio of distance (a) extending through the widest place of the cross-section of the bonding wire, to distance (b) extending through the widest place of the cross-section of the bonding wire along a straight line with respect to distance (a).

If the bonding wire, for example, has an elliptical cross-section, the aspect ratio is the ratio of minor axis to major axis of the elliptical cross-section. If the bonding wire has a rectangular cross-section, the aspect ratio is the ratio of width to length of the rectangular cross-section. For example a bonding wire having a rectangular cross-section with dimensions of 2,000 µm×200 µm has an aspect ratio of 0.1.

According to a preferred embodiment of the invention, the fraction accounted for by the material of the wire jacket is in the range of 5-50% of the area, more preferably in the range of 10-40% of the area, and even more preferably in the range of 15-35% of the area, relative to the area of the cross-section of the bonding wire.

According to another refinement of the invention, the thickness of the wire jacket is in the range of 1:5 to 1:20, and more preferably in the range of 1:8 to 1:15, relative to the thickness of the bonding wire.

According to another particularly preferred embodiment, the bonding wire according to the invention has a rectangular cross-section. In this case, the width of the rectangular cross-section is preferably in the range of 10-500 µm, more preferably in the range of 50-400 µm, and particularly preferably in the range of 100-300 µm. In this context, the length of the rectangular cross-section is preferably in the range from 200-5,000 µm, more preferably in the range of 400-4,000 µm, and particularly preferably in the range of 1,000-3,000 µm.

Preferably, the bonding wires described above are used for bonding. In this context, bonding shall be understood to mean connecting a component to a substrate by means of bonding wire, preferably through welding the bonding wire to corresponding contact surfaces.

According to a preferred embodiment, the component is selected from the group consisting of passive components, discrete semi-conductors, and integrated circuits. Preferred passive components include resistors, capacitors, and inductors. Preferable discrete semi-conductors include diodes and transistors. Moreover, special versions such as quartzes, sensors, optical elements and micro-systems (micro-electro-mechanical systems, MEMS) can be used as components just as well.

Preferably, the substrate is a wiring support. It can be structured to be single-layered or multi-layered. Preferably, the substrate is selected from the group consisting of laminated substrates, thin-film substrates, and ceramic substrates.

According to a preferred embodiment, bonding proceeds by means of ultrasound, for example through wedge-wedge bonding or thermosonic ball-wedge bonding.

Accordingly, the scope of the invention also includes a sub-assembly comprising at least one substrate and one component that are connected by means of at least one bonding wire of the type described above. In this context, the bonding wire is preferably bonded onto connecting surfaces situated on the substrate and on the component. According to a particularly preferred embodiment, the bonding wire is welded to connecting surfaces on the substrate and on the component. In this context, it is preferable for non-bonded bonding wire to be situated between the connecting surfaces of the substrate and of the component, in particular non-welded bonding wire, forming a loop.

The bonding wire according to the invention is produced by first providing a round wire comprising a wire core made of a first material and a wire jacket that envelopes the wire core and is made of a second material, in which the first material comprises a first metal and the second material comprises a second metal different from the first metal, and then reforming the round wire into a bonding wire that has an aspect ratio of no more than 0.8.

The production of the round wire may follow known procedures. Preferably, the round wire having a core-jacket structure is produced by extrusion molding. On the other hand, it is feasible just as well to provide a round wire made of a first material and coat it with a second material on its circumference. Preferably, coating in this case is effected through vapor deposition, sputtering or galvanic deposition of the second material. The natures of the first material and second material are described above.

In the scope of the invention, a round wire is understood to be a wire having an essentially round cross-section. The round wire preferably has an aspect ratio in the range of 0.85-1.2 and in particular in the range of 0.9-1.1. The diameter of the round wire preferably is 100-2,000 μm and particularly preferably is 200-1,000 μm.

The round wire is reformed according to the method of the invention. Reforming is preferably understood to mean a process in which a change in the shape of the work piece processed is attained without an attendant significant change in the mass of the work piece processed. A cutting process, for example, is not a reforming process, since the cutting process is associated with a reduction of the mass of the work piece processed by the mass of the severed part. Accordingly, reforming preferably does not involve any tools that may give rise to the formation of burrs along the longitudinal side of the wire, in particular no cutting tools. Preferably, the round wire is not cut after being provided. In particular, the round wire is not cut during reforming.

According to an embodiment of the invention, reforming is effected by means of flat-rolling. The rolling conditions are adapted suitably in this context such that the bonding wire has an aspect ratio of no more than 0.8 after rolling.

According to another embodiment of the invention, reforming proceeds through drawing and/or extruding the round wire through a drawing die. For this purpose, drawing dies are provided first. These drawing dies have openings of a shape and cross-section that essentially correspond to the shape and cross-section to be provided to the bonding wires. Accordingly, the drawing die contains openings with an aspect ratio of no more than 0.8. However, the exact geometry of the openings of the drawing die is a function of the bonding wire materials that are used. Since the bonding wire may experience some increase in cross-section after being drawn due to the resilience of the bonding wire materials that are used, the openings in the drawing die need to have a cross-section that is smaller than the desired cross-section of the bonding wire. Lastly, the wire is drawn through the openings of the drawing die provided and thus takes on the shape of the openings of the drawing die.

The wires obtained may be cleaned after reforming, if needed. Preferably, cleaning is effected using customary cleaning agents and customary procedures.

The bonding wires thus obtained are preferably annealed after cleaning. Annealing allows the bonding wires to be provided with the desired properties, depending on their exact nature.

Subsequently, the bonding wires may be packaged, for example in order to protect them from oxidation and damage.

Since the above-mentioned production method already uses, as starting material, a wire that comprises a wire core made of a first material and a wire jacket that envelops the wire core and is made of a second material, and the wire is simply reformed, there is no longer any need to cut the wire. As a result, the bonding wires according to the invention contain no burrs. Accordingly, damage to the bonding surfaces during the bonding of the bonding wires, as well as short-circuiting during operation of sub-assemblies provided with the bonding wires, may be prevented.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A bonding wire comprising a wire core and a wire jacket fully enveloping the wire core, wherein the wire core comprises a first material selected from the group consisting of copper, copper alloys, and inter-metallic phases containing copper, and the wire jacket comprises a second material selected from the group consisting of aluminum, aluminum alloys, and inter-metallic phases containing aluminum, wherein the bonding wire has an aspect ratio of no more than 0.8, a thickness of the wire jacket is at least 10 microns, an area of the wire jacket comprises 5-50% of the cross-sectional area of the bonding wire, and the bonding wire has a rectangular cross section having a width in a range of 10 to 500 microns and a length in a range of 400 to 4000 microns, and wherein the aspect ratio is a ratio of the width to the length of the rectangular cross section of the bonding wire.

2. A sub-assembly comprising at least one substrate and a component, wherein the at least one substrate and the component are connected through a bonding wire according to claim 1.

3. A method for producing a bonding wire according to claim 1, comprising:
   (i) providing a round wire comprising a wire core and a wire jacket enveloping the wire core, wherein the wire core comprises the first material and the wire jacket comprises the second material; and
   (ii) reforming the round wire.

4. The method according to claim 3, wherein the reforming comprises flat rolling the round wire.

5. The method according to claim 3, wherein the reforming comprises drawing the round wire through a drawing die.

6. The sub-assembly according to claim 2, wherein the bonding wire is connected to at least one of the substrate and the component by wedge-wedge bonding.

* * * * *